US007501589B1

(12) United States Patent
Graham

(10) Patent No.: US 7,501,589 B1
(45) Date of Patent: Mar. 10, 2009

(54) SHIELD AND METHOD FOR REDUCING THE STRAY ELECTRIC ENERGY (SEE) GENERATED BY A HIGH EFFICIENCY LIGHT BULB

(75) Inventor: Martin H. Graham, Berkeley, CA (US)

(73) Assignee: And Yet, Inc., Berkeley, CA (US)

( * ) Notice: Subject to any disclaimer, the term of this patent is extended or adjusted under 35 U.S.C. 154(b) by 0 days.

(21) Appl. No.: 11/904,991

(22) Filed: Sep. 28, 2007

(51) Int. Cl.
*H05K 9/00* (2006.01)

(52) U.S. Cl. ....................... 174/382; 174/384; 174/392; 362/260; 362/290; 362/292; 362/311

(58) Field of Classification Search ................. 174/381, 174/389, 392, 382, 384; 362/293, 257, 260, 362/290, 311
See application file for complete search history.

(56) References Cited

U.S. PATENT DOCUMENTS 3,885,150 A * 5/1975 Ott ............................ 362/263
5,731,663 A * 3/1998 Davis ......................... 315/194
6,424,125 B1 7/2002 Graham
2002/0172037 A1* 11/2002 Schnaufer et al. ........... 362/221
2005/0117340 A1* 6/2005 Lee et al. .................... 362/252

OTHER PUBLICATIONS

Kaiser, Kenneth L., "Electromagnetic Compatibility Handbook," (2005) pp. 24-64 through 24-70, CRC Press, Boca Raton, Florida.

* cited by examiner

*Primary Examiner*—Hung V Ngo
(74) *Attorney, Agent, or Firm*—Blakely, Sokoloff, Taylor & Zafman LLP

(57) ABSTRACT

A conductive shield for surrounding a high efficiency light bulb such as a spiral fluorescent bulb is described. A conductive curtain having apertures through which light may pass is connected to the threaded grounded base of the bulb. The apertures in the curtain present high impedance to stray electrical energy (SEE) from the bulb thereby reducing SEE.

7 Claims, 6 Drawing Sheets

SHIELD AND METHOD FOR REDUCING THE STRAY ELECTRIC ENERGY (SEE) GENERATED BY A HIGH EFFICIENCY LIGHT BULB

FIELD OF THE INVENTION

This invention relates to the reduction of the stray electrical energy (SEE) from a high efficiency light bulb.

BACKGROUND OF THE INVENTION

High efficiency light bulbs such as fluorescent bulbs, made to replace incandescent light bulbs, are becoming widely used because of their higher efficiency. They provide more light per watt of power consumed. These bulbs typically have the disadvantage of emitting more stray electrical energy (SEE) than incandescent bulbs.

The SEE is caused by high frequency electrical currents in the bulb. SEE may be electromagnetic radiation, electric fields, or combinations such as associated with the near field of an antenna. SEE may present a health risk depending on its intensity and frequency components.

Consequently, more attention needs to be paid to SEE from high efficiency light bulbs. A device for reducing high frequency components is disclosed in U.S. Pat. No. 6,424,125.

SUMMARY OF THE INVENTION

An apparatus and method for reducing the stray electrical energy (SEE) generated by a high efficiency light bulb, including its associated circuits, is described. A curtain of a conductive material is disposed about the bulb and electrically connected to the threaded base of the bulb. The curtain has openings through which light passes. The openings have a dimension, such as the radius of a circular opening, which is preferably at least a factor of three smaller than the distance from the curtain to the bulb's source of SEE.

DETAILED DESCRIPTION

A method and apparatus for reducing stray electrical energy (SEE) from a high efficiency light bulb is described. In the following description, numerous specific details are set forth to provide a thorough understanding of the present invention. It will be apparent to one skilled in the art that the apparatus and method of the present invention may be practiced without these specific details. In other instances well-known fabrication techniques are not described in detail, in order not to unnecessarily obscure the following description.

Figure 1:
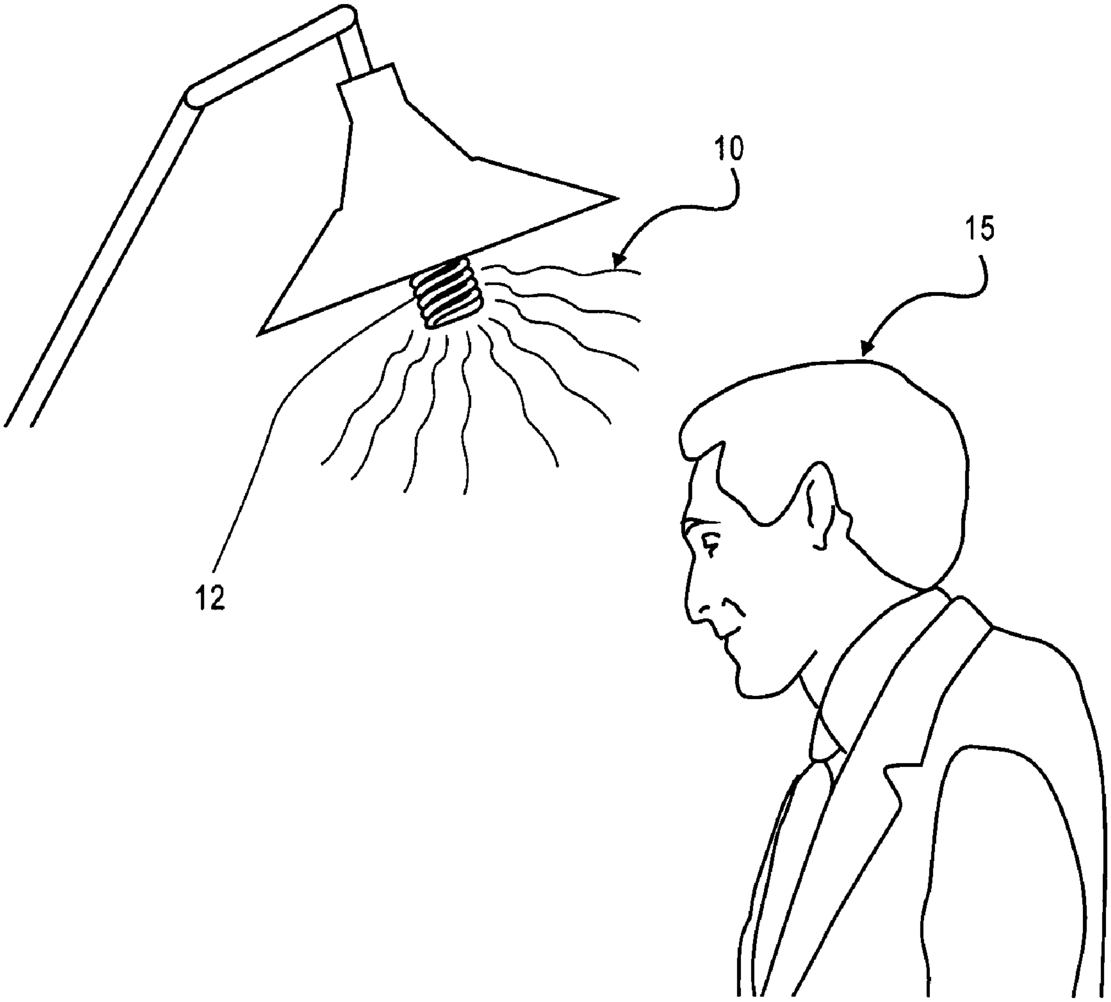
FIG. 1 is a diagram illustrating the SEE produced by a high efficiency light bulb.

Referring to FIG. 1, SEE 10 is shown radiating from the high efficiency light bulb 12. A person 15 near the light bulb 12, such as a person using it as a reading lamp, may come into close proximity with the SEE. SEE may cause adverse health effects if sufficiently intense.

Figure 2A:
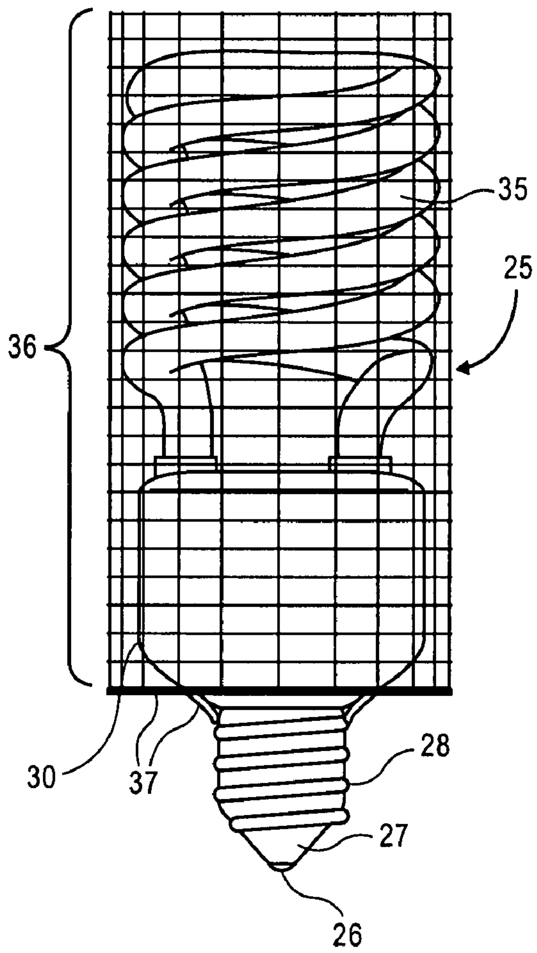
FIG. 2A is a diagram of an embodiment of the shield with its base connection, disposed about a high efficiency light bulb.

Referring to FIG. 2A, a high efficiency light bulb, specifically a spiral fluorescent bulb 25, is illustrated. It includes an electrical contact 26 which typically receives the high voltage for the bulb, an insulator 27 and a threaded base 28, sometimes referred to as a cap or sleeve. The base 28 screws into a socket in the same way an incandescent bulb screws into the socket, such that the contact 26 contacts the source of high voltage in the socket while the threaded base 28 provides a ground connection to complete the electrical path through the bulb. The high efficiency bulb 25 includes a cylindrical section 30 which contains electronic circuitry to control the current flow through the gas contained within the glass spiral 35. As will be appreciated, other high efficiency bulbs may be used such as a covered spiral bulb or bulbs employing technologies other than "fluorescent."

In the electronic bulb circuits, the SEE is caused, in part, by switching transients and the like. The SEE radiates typically from the entire bulb, including the section 30 shown in FIG. 2A.

In accordance with the present invention, a shield is disposed about the bulb including sections 30 but not the base or contact 26). The shield comprises a curtain 36 forming the upper part of the shield which extends from the top of the bulb to its base, and a connection, shown as connection 37, which connects the shield to the base 28. The curtain 36 is electrically conductive with the connection 37 provides an electrically conductive path between the curtain 36 and the threaded base 28. The curtain is generally cylindrically shaped, to fit over the bulb. It is preferably fabricated from a wire mesh having a plurality of openings. These openings allow light to pass from the bulb into the surrounding regions. The size of the openings and their relationship to the bulb are discussed later in conjunction with FIGS. 4A, 4B and 4C. (Note in the figures, particularly FIGS. 2A, 2B, 3 and 5, the mesh openings of the curtain are not necessarily to scale.)

Figure 2B:
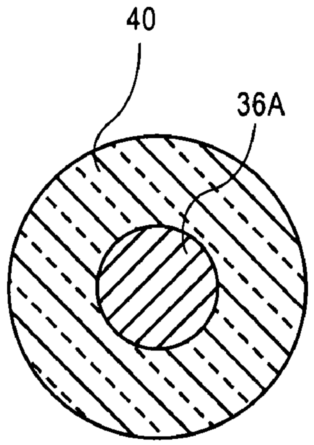
FIG. 2B is a diagram of a cross-sectional view of a wire comprising the shield's curtain of FIG. 2A.

For reasons that will be explained, in some embodiments, the curtain 36 is encased or enclosed within an insulator. In FIG. 2B, a cross-section is shown of the wire 36A, which forms the meshed curtain of FIG. 2A. The wire 36A is enclosed by insulator 40. In the preferred embodiment, when the insulator 40 is used, the entire curtain 36 is insulated such that if the base 28 is inadvertently at a high potential, the potential is not felt by a person touching the curtain.

In a typical electrical power distribution arrangement, such as used in virtually all U.S. homes and businesses, the threaded base 28 of the bulb engages the "white" power lead which is at zero potential or ground potential. Consequently, the connection 37 connects the curtain to ground. It is this connection which causes the SEE passing through the curtain to be substantially attenuated. (The amount of this attenuation is discussed later.) In more modern wiring systems a 110, 3-prong plug is used with a centrally disposed round prong providing a ground connection. This type of plug can only be inserted one way into a power receptacle. For this reason, if the power wiring is correct, one prong of the plug is always at ground potential. This prong will be connected to the base 28.

In some cases, the power wiring may not be correct, or an older two-prong plug may be used installable in two possible ways into the power receptacle. Then, it is possible that the base 28 is at a high potential, relative to ground. When this occurs the curtain will be at a high potential and can cause an electrical shock. That is why, for some embodiments, an insulator 40 is used around the curtain (See FIG. 2B). Thus, even if the wiring is incorrect, or the curtain is otherwise at a high potential, a person touching the curtain will be protected from the high voltage. Note from the standpoint of reducing the SEE, it makes no difference whether the base is at a high or low potential, it is the potential difference between the contact 26 and the base 28 that is needed, not any particular polarity.

In using the shield of the present invention, a power plug may first be tested to determine if it is wired properly. Also the shield itself may be checked to determine if it is at ground potential. Numerous commercially available testers may be used to confirm the ground connection such as the "Voltalert" from Fluke®.

Figure 3:
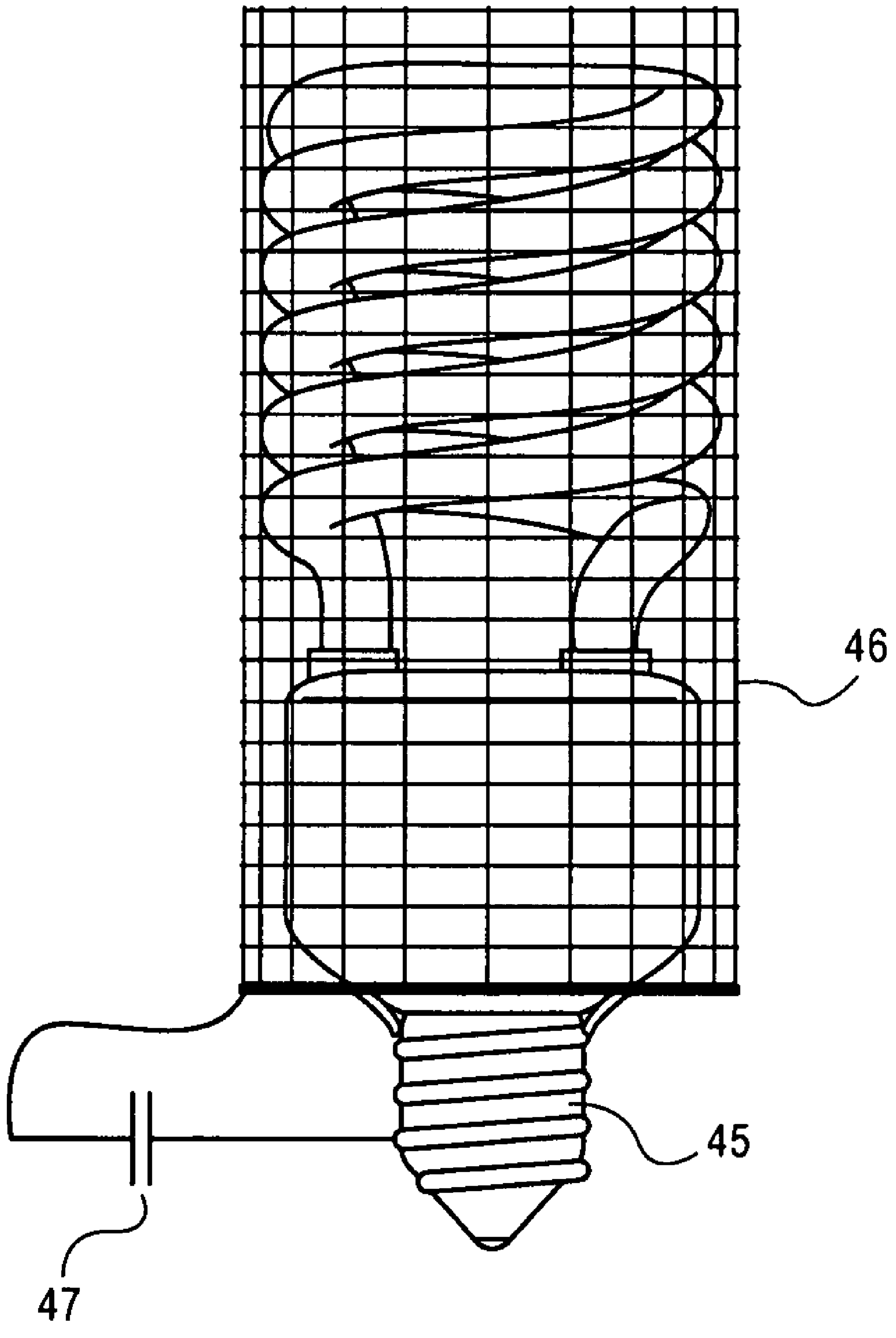
FIG. 3 is one embodiment of the present invention with a capacitor added to the base connection between the shield's curtain to the base of the light bulb.

In the embodiment of FIG. 3, the base 45 is shown coupled to the curtain 46, however, here through a capacitor 47. This capacitor helps mitigate the effect of a high voltage on the base 45. The capacitor 47 is selected such that it presents a relatively high impedance to the 60 Hz power signal, and at the same time presents a relatively low impedance to the higher frequency components associated with the SEE. Consequently, the SEE, caught by the curtain 46, sees a low impedance path to the base 45. By way of example, if the capacitor 47 is a 0.01 μf capacitor, it provides substantially less impedance to an 80 KHz signal from the curtain 46 than it does to a 60 Hz signal. Therefore, if the base 45 is at a high voltage, a person in contact with the curtain 46 will be subjected to only a relatively small current.

Figure 5:
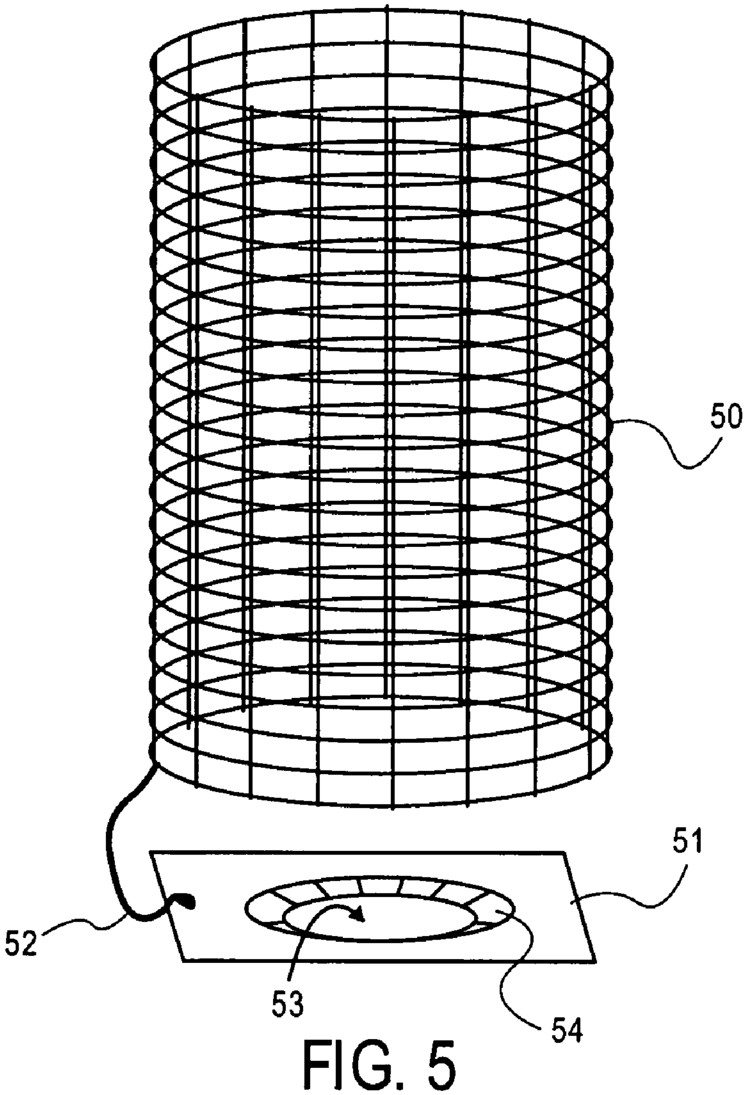
FIG. 5 is a diagram of another embodiment of the shield with its base connection.

In FIG. 5, the curtain 50 is connected to a conductive disk 51 through the wire 52. The disk 51 has an aperture 53. The disk 51 is cut and bent to define the prongs 54. The base of a bulb, once inserted into the curtain 50, can be threaded through the aperture 53 such that the prongs 54 remain in contact with the base, and as a result provide a conductive path from the curtain to the base. In one embodiment, both the curtain 50 and disk 51, with its integrally formed prongs 54, are fabricated from copper.

Figure 6:
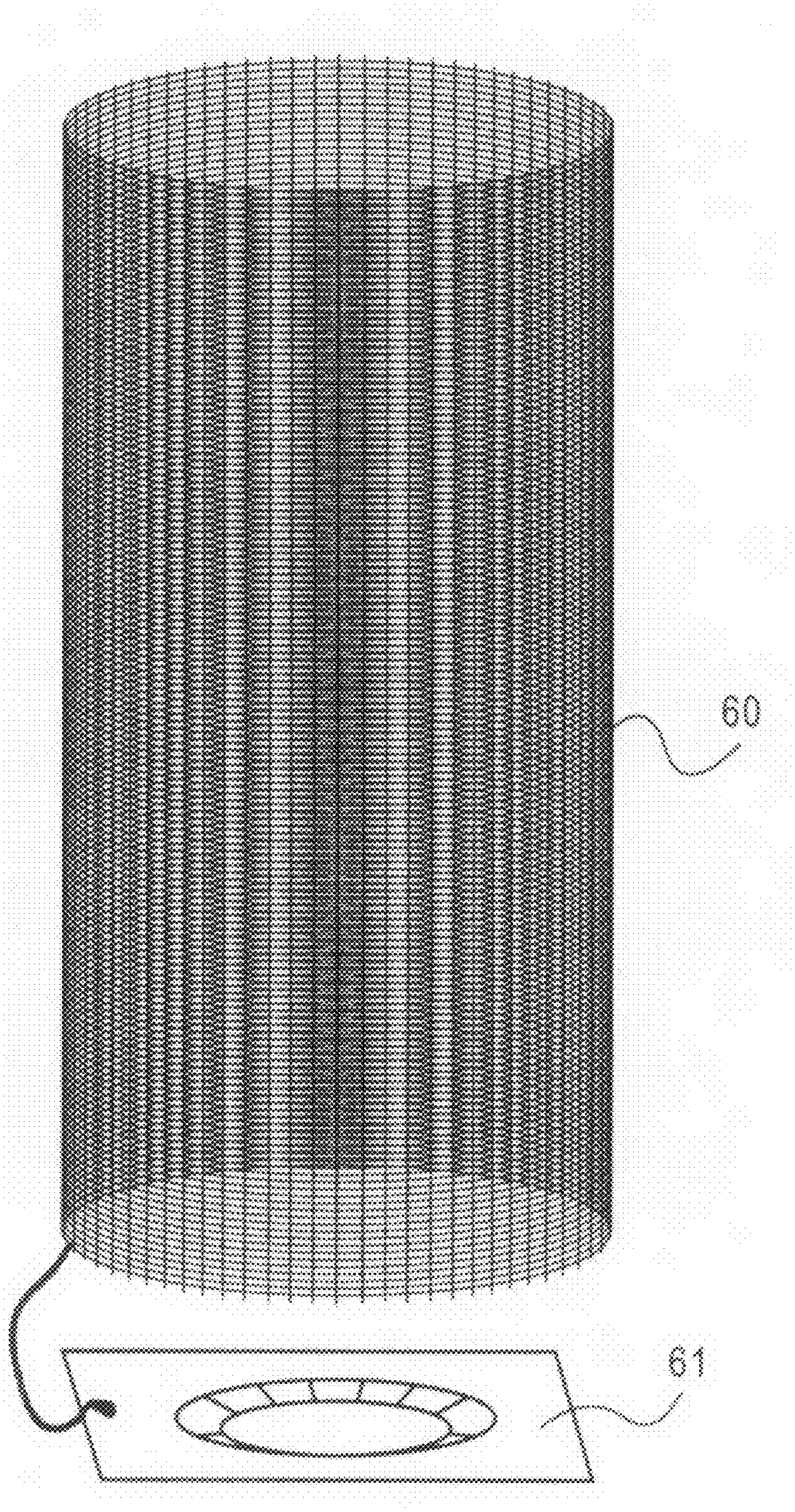
FIG. 6 is yet another embodiment of the shield with its base connection.

In FIG. 6, still another embodiment is shown where the curtain is formed from a copper mesh of relatively small openings. Again, a disk 61, similar to the disk 51 of FIG. 5, is electrically connected to the mesh curtain 60. In the case of FIG. 6, the mesh 60 fits, much like a stocking over the bulb.

Figure 7:
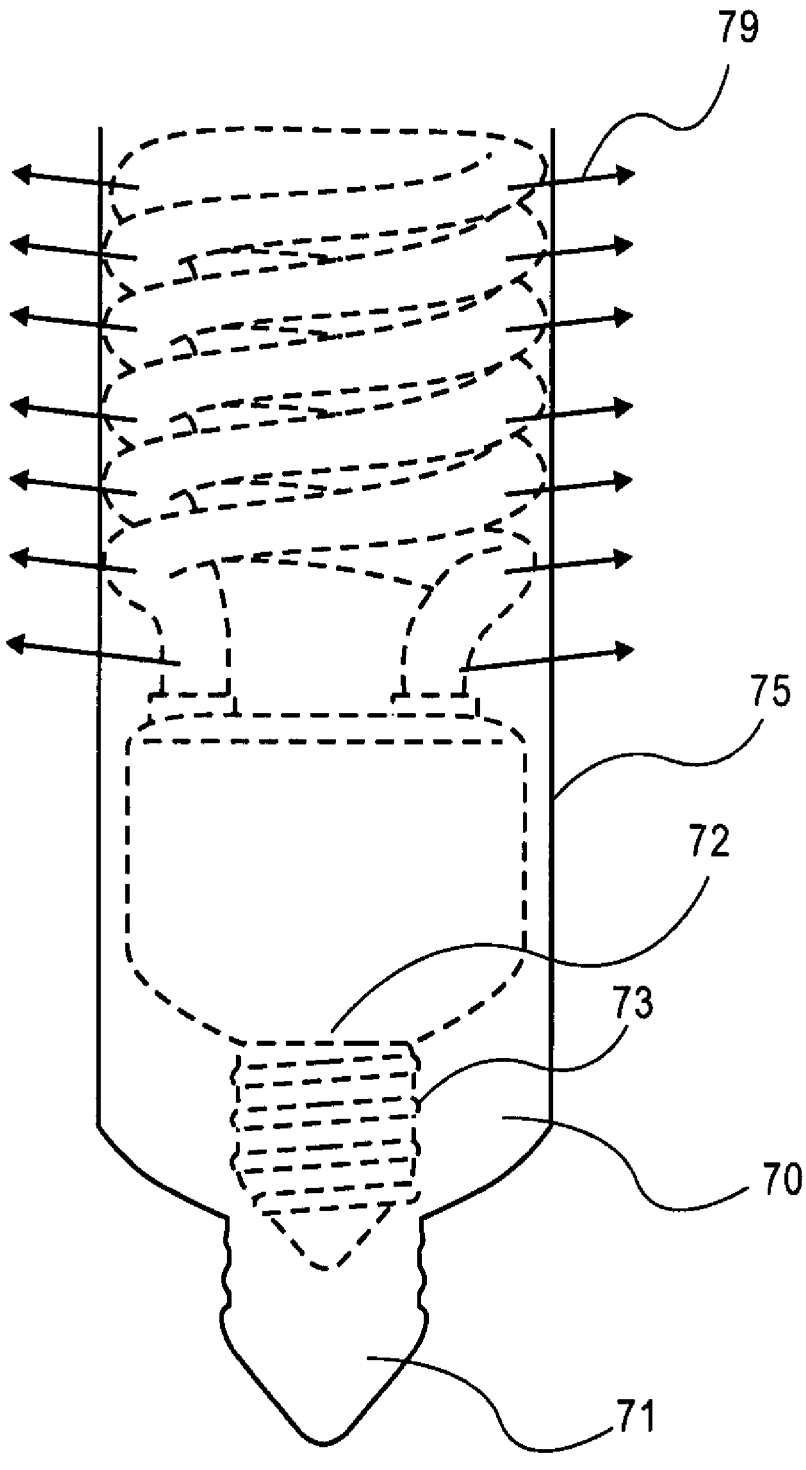
FIG. 7 is still another embodiment of the shield formed as part of an interposer.

In the embodiment of FIG. 7, the shield is formed as an interposer 70. The interposer includes a threaded base with an electrical contact, generally shown as base 71 in FIG. 7. This base engages a socket of a lamp, or the like. The interposer 70 has a socket 73 for receiving a bulb 72. The bulb 72 is powered from the base 71 of the interposer. A conductive curtain 75, which can be the same as the curtains described in the other embodiments, is formed as part of the interposer and is electrically connected to the threaded part of the base 71. As in the other embodiments, light from the bulb passes through apertures in the curtain 75 as shown by the light 79. The SEE is impeded by the apertures in the curtain because of its connection to the base.

Figure 4A:
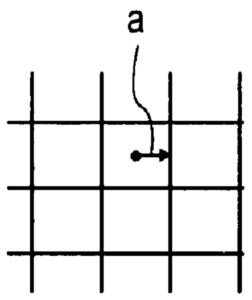
FIG. 4A illustrates a square grid pattern of a curtain.
Figure 4B:
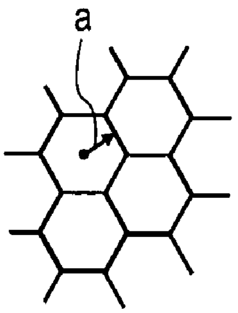
FIG. 4B illustrates a hexagonal curtain pattern.

In the book *Electromagnetic Compatibility Handbook* by Kenneth L. Kaiser, published by CRC Press (copyright 2005) (Kaiser book), beginning at section 24.21, there is a discussion concerning the gain of a circular aperture when uniformly illuminated by a plane wave. Other sections of the Kaiser book describe coupling through an aperture, and the electric field along the axis of a circular aperture versus distance relative to the aperture's radius. This is helpful in understanding the attenuation of SEE provided by the shields described above. In general, the equations used in the Kaiser book describe the attenuation for a circular opening. The curtain of the shield may not have circular openings, but rather square, hexagonal, octagonal, or other shaped openings. For purposes of using the equations in this book, an approximation can be made for other openings by selecting a dimension of the opening, corresponding to the radius of a circle. For instance, for a square mesh such as shown in FIG. 4A, the distance "a" is selected. In FIG. 4B, for a hexagonal pattern in the curtain openings, another dimension "a" is selected since this somewhat corresponds to a radius of a circle. As will be appreciated, for other openings a radius "a" may be selected.

The electric field along the axis of the opening attenuates logarithmically with the distance from the field's source. This is shown in FIG. 24.20 in the Kaiser book. Where "a" is equal to the distance from the field's source, the attenuation is approximately 1/10th. Ideally the dimension of the opening (A) should be smaller than the distance from the SEE source, preferably by three or more. For a factor of three the attenuation is $1/100^{th}$.

Figure 4C:
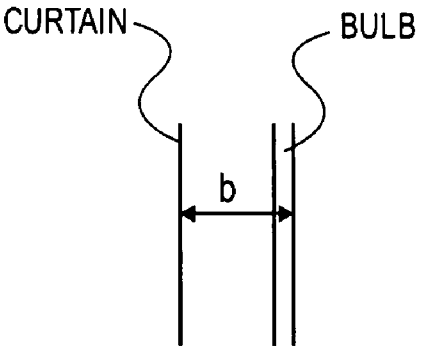
FIG. 4C illustrates the distance between the shield's curtain and the bulb.

The distance from the source to the curtain is shown as "b" (in FIG. 4C). This distance is shown from the inside of the bulb's housing. It will be appreciated that the distance "b" and its relation to "a" is not a precise constant and will vary along the length of the curtain. Consequently, "a" being smaller than "b" should be considered on average for the curtain and is not a precise measurement. This is, in part, because the curtain may be closer to the shield in some regions compared to others. Also, the source of the SEE is, in many cases, not precisely definable, as it may be emitted, for instance, from particular electrical components within the associate electronics. In some cases, the very thickness of, for example, the housing containing the electronic circuits shown as cylindrical section 30 of FIG. 2A, and the internal distance of the component from the housing will be sufficient to meet the criteria of "a" being less than "b" by a factor of three or more especially for a closely woven mesh. A more closely woven mesh (smaller "a") provides better attenuation.

Thus, a shield for reducing SEE from a high efficiency light bulb has been described.

What is claimed is:

1. A shield for reducing stray electrical energy (SEE) from a high efficiency light bulb, comprising:

a curtain of a conductive material for disposing about the exterior of the bulb, having openings through which light from the bulb passes, the openings having a dimension smaller than the distance between the SEE's source and the curtain when the curtain is disposed about the bulb; and an electrical connection providing a conductive path between the curtain and a threaded base of the bulb which includes a conductive disk with an aperture for receiving the base of the bulb.

2. The shield of claim 1, wherein the conductive material of the curtain is surrounded by a non-conductive material.

3. The shield of claim 1, wherein the dimension is smaller by a factor of three or greater.

4. The shield of claim 1, wherein the curtain comprises a copper mesh.

5. The shield of claim 1, wherein the curtain is a sleeve which slips over the bulb.

6. The shield of claim 1, wherein the electrical connection includes a capacitor.

7. A method of reducing stray electrical energy (SEE) from a high efficiency light bulb comprising:

placing about the bulb a conductive curtain having openings through which light passes, the openings having a dimension which is less than the distance between the curtain and the bulb's source of SEE; and connecting the conductive curtain to a common potential through a conductive disk having an aperture for receiving the base of the bulb.

* * * * *